(12) United States Patent
Ellis

(10) Patent No.: US 6,218,885 B1
(45) Date of Patent: Apr. 17, 2001

(54) CIRCUIT AND METHOD FOR PROVIDING TEMPERATURE STABILITY IN AN FM QUADRATURE DETECTOR

(75) Inventor: Michael G. Ellis, Alpharetta, GA (US)

(73) Assignee: Antec Corporation, Duluth, GA (US)

( * ) Notice: Subject to any disclaimer, the term of this patent is extended or adjusted under 35 U.S.C. 154(b) by 0 days.

(21) Appl. No.: 09/309,529

(22) Filed: May 11, 1999

Related U.S. Application Data

(60) Provisional application No. 60/085,207, filed on May 12, 1998.

(51) Int. Cl.$^7$ .................................................. H03K 17/14
(52) U.S. Cl. ........................... 327/378; 327/558; 327/357
(58) Field of Search .......................... 327/538, 551–553, 327/558, 512, 513, 378, 355, 357, 358, 359; 455/326

(56) References Cited

U.S. PATENT DOCUMENTS

| | | | |
|---|---|---|---|
| 4,633,316 | * 12/1986 | Burke et al. | 358/197 |
| 4,662,001 | * 4/1987 | Cruz et al. | 455/340 |
| 4,667,170 | * 5/1987 | Lofgren et al. | 331/17 |
| 5,708,394 | * 1/1998 | Karlquist | 331/1 R |
| 5,821,818 | * 10/1998 | Idei et al. | 331/17 |

* cited by examiner

Primary Examiner—My-Trang Nuton
(74) Attorney, Agent, or Firm—Troutman Sanders LLP; Gerald R. Boss

(57) ABSTRACT

A circuit and method for providing temperature stability in an FM quadrature detector. The circuit includes a feedback branch that feeds a portion of the dc output voltage to a varactor diode that is connected in parallel with a capacitor of an LC circuit in the quadrature detector. When the ambient temperature of the LC circuit of the quadrature detector changes, the resonant frequency shifts from the desired center value and a dc voltage is introduced at the output of the quadrature detector. The dc voltage is input to the varactor diode via the feedback circuit branch, and the capacitance of the varactor diode, which is dependent on the dc voltage applied to it, causes the overall capacitance of the LC circuit to change. The change in overall capacitance of the LC circuit caused by the capacitance of the varactor diode causes the resonant frequency of the quadrature detector to shift to be more closely maintained at the desired center frequency. In this manner, the unwanted dc voltage caused by ambient temperature variations is reduced or eliminated.

8 Claims, 3 Drawing Sheets

CIRCUIT AND METHOD FOR PROVIDING TEMPERATURE STABILITY IN AN FM QUADRATURE DETECTOR

CROSS-REFERENCE TO RELATED APPLICATION

The present application claims the benefit of priority of U.S. Provisional Patent Application Serial No. 60/085,207, filed May 12, 1998, entitled "Varactor Diode Provides Temperature Stability for FM Quadrature Demodulator".

TECHNICAL FIELD

The present invention relates generally to FM receivers and more particularly relates to a circuit for providing temperature stability of an FM quadrature detector.

BACKGROUND OF THE INVENTION

Typical FM receivers, such as the receiver 10 shown in FIG. 1, include a quadrature detector 12 to demodulate frequency shift keyed (FSK) signals and other types of FM signals. As is well known in the art, a quadrature detector 12, as shown in FIG. 2, accepts an input signal on line 14 into a mixer 16. The input signal is also input to an LC circuit, comprising capacitor 18 and inductor 20, and which may also include a resistor 21. Inductor 20 is typically a tunable inductor. The LC circuit feeds an input to the mixer on line 22, which is phase shifted 90 degrees from the input signal on line 14. The mixer generates an output signal on line 24, which is then typically input to a low pass filter 26, which generates an output signal on line 28.

The LC circuit of the quadrature detector has a resonant frequency that is adjusted to match the center frequency of the Intermediate Frequency (IF) of the receiver. For purposes of the description herein, an IF of 10.7 MHz, which is a standard intermediate frequency for an FM receiver, will be used as an example. For an IF of 10.7 MHz, the values of L and C are set as shown in FIG. 2 so that the resonant frequency of the LC circuit is 10.7 MHz. As is well known in the art, the resonant frequency of an LC circuit is determined by the following equation:

$$f_{res} = \frac{1}{2\pi\sqrt{LC}}$$

where L is the inductance of the circuit in henries, and C is the capacitance of the circuit in farads.

However, if the temperature of the LC circuit changes, the value of the inductance L of inductor 20 and the value of the capacitance C of capacitor 18 may vary, thereby causing the resonant frequency of the LC circuit to shift. Typically, when the temperature increases, the resonant frequency decreases, and vice versa. When the resonant frequency shifts from the center frequency, then the phase shift of the signal on line 22 is not 90 degrees, but shifts between zero and 180 degrees. If the resonant frequency shifts in the quadrature detector, then an undesirable dc voltage is introduced on output line 24 and output line 28, in a manner well known to those skilled in the art. FIG. 4 shows the effect of the dc offset causing distortion on the output signal.

Therefore, a need exists in the art for a circuit that provides automatic temperature stability for FM quadrature detectors so that the resonant frequency does not shift, thereby ensuring that the quadrature detector operates in the middle of its linear region.

SUMMARY OF THE INVENTION

The present invention includes a circuit and method for providing temperature stability in an FM quadrature detector. The circuit includes a feedback branch that feeds a portion of the dc output voltage to a varactor diode that is connected in parallel with a capacitor of an LC circuit in the quadrature detector. When the ambient temperature of the LC circuit of the quadrature detector changes, the resonant frequency shifts from the desired center value and a dc voltage is introduced at the output of the quadrature detector. The dc voltage is input to the varactor diode via the feedback circuit branch, and the capacitance of the varactor diode, which is dependent on the dc voltage applied to it, causes the overall capacitance of the LC circuit to change. The change in overall capacitance of the LC circuit caused by the capacitance of the varactor diode causes the resonant frequency of the quadrature detector to shift to be more closely maintained at the desired center frequency. In this manner, unwanted distortion caused by a change in the dc voltage, due to temperature, is reduced or eliminated.

DETAILED DESCRIPTION OF THE PREFERRED EMBODIMENTS

Figure 1:
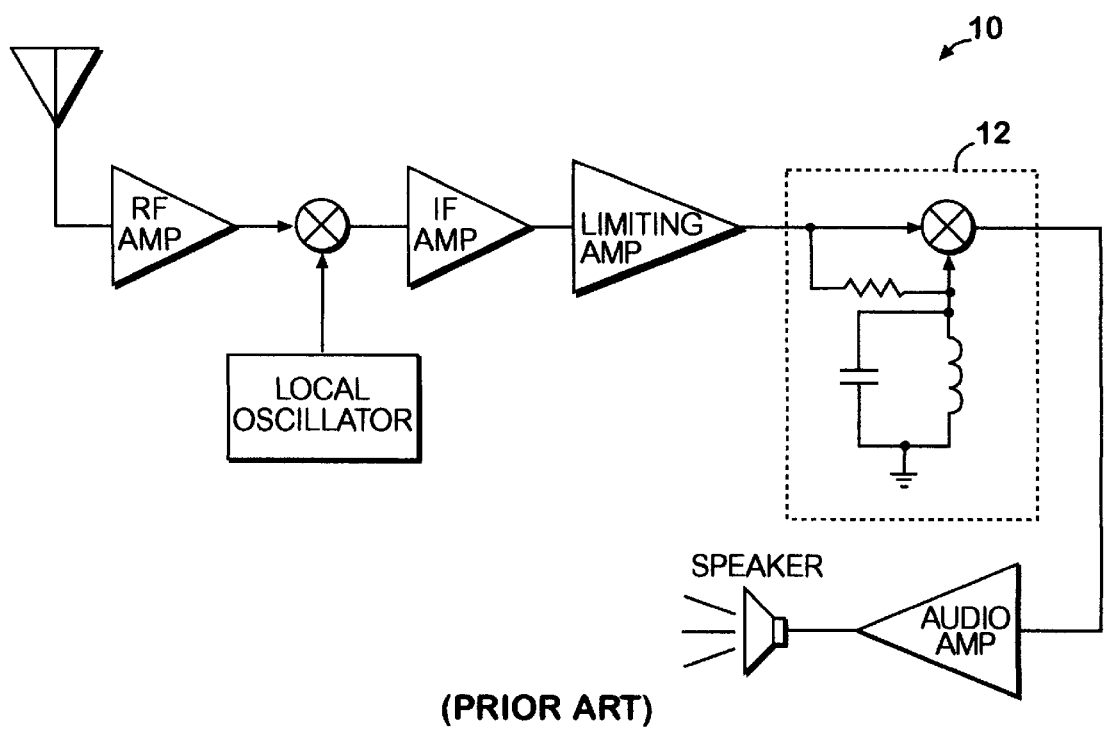
FIG. 1 is a block diagram of a typical FM receiver.
Figure 2:
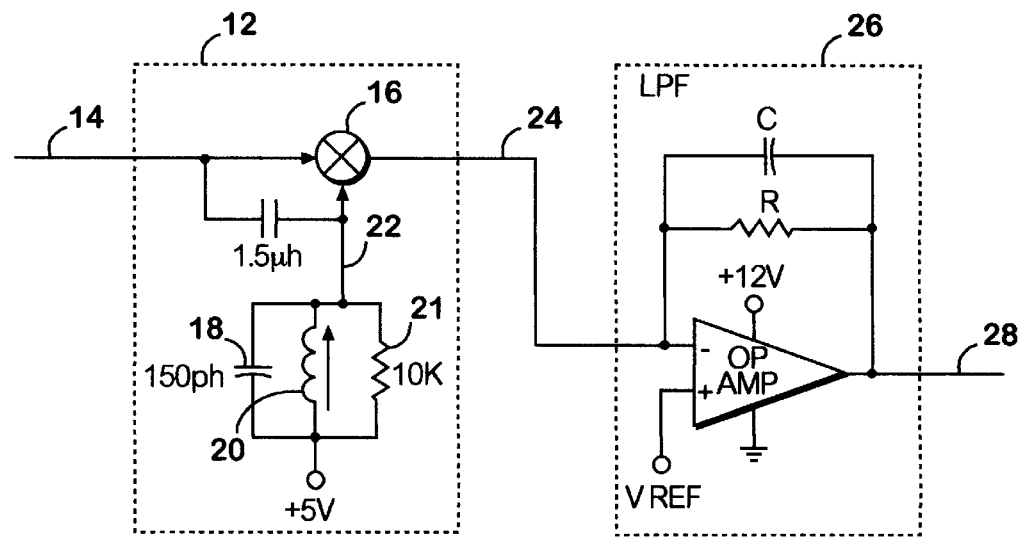
FIG. 2 is a diagram of a typical quadrature detector in a typical FM receiver.
Figure 3:
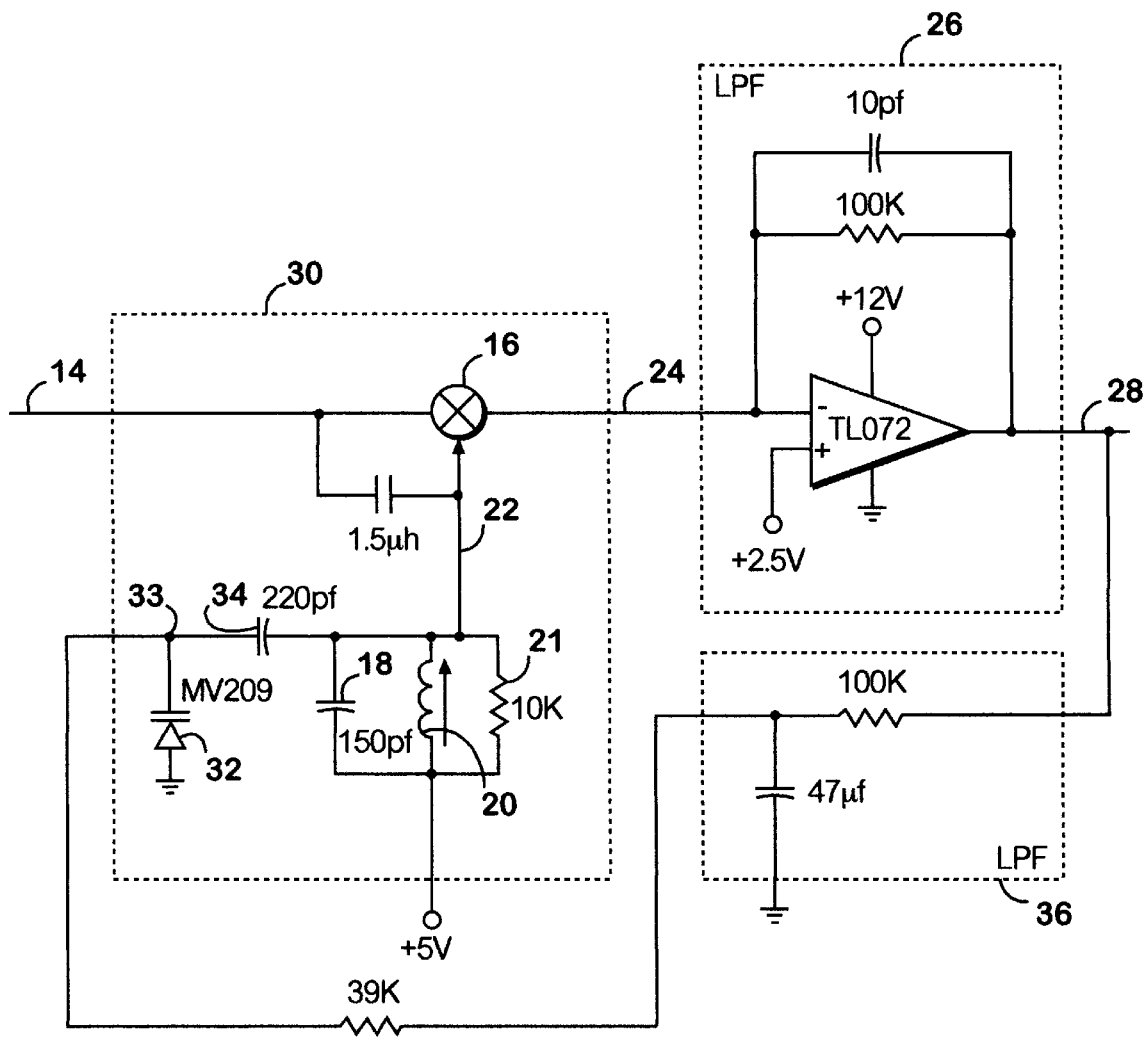
FIG. 3 is a circuit diagram showing a quadrature detector having automatic temperature stability in accordance with the present invention.
Figure 4A:
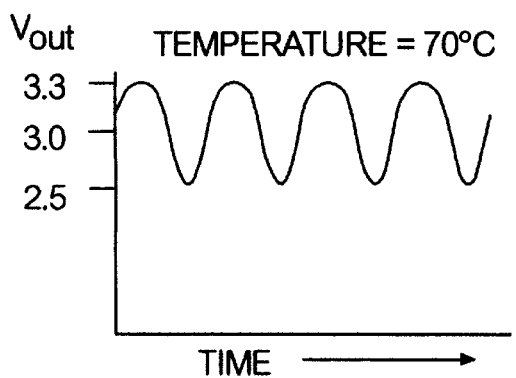
FIG. 4 shows the output signal variation without temperature compensation at various temperatures.

The present invention includes a circuit and method for providing temperature stability in an FM quadrature detector. As shown in FIG. 3, a quadrature detector in which the invention is implemented is shown at 30. It will be understood that the component values identified in FIG. 3 are for example purposes only, and the present invention should not be construed to include components that are limited to these values.

The quadrature detector 30 includes a mixer 16 and an LC circuit having a capacitor 18 and a variable inductor 20. Assuming an IF of 10.7 MHz, for example, the variable inductor, which has a maximum inductance of 1.5 $\mu$h, is tuned so that the resonant frequency of the LC circuit is 10.7 MHz at a given ambient temperature. However, the circuit of the present invention also includes a varactor diode 32 connected in parallel with capacitor 18 of the LC circuit. The circuit may also include an additional capacitor 34 connected between varactor diode 32 and capacitor 18.

The circuit includes a feedback branch that feeds a portion of the output signal on line 28 to the varactor diode at junction 33. The output signal may first pass through a low pass filter 36 prior to being input to the varactor diode at junction 33. Therefore, the circuit of the present invention feeds the dc signal on output line 28 to the varactor diode.

Figure 5A:
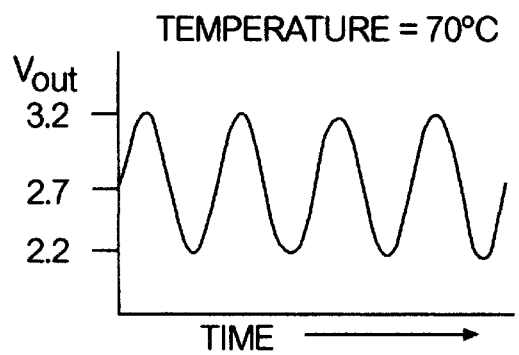
FIG. 5 shows the output signal variation with temperature compensation at various temperatures.
Figure 4B:
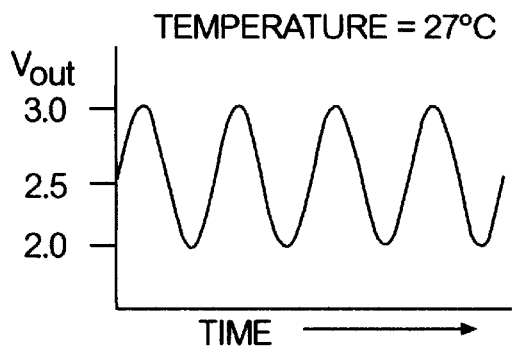
Figure 5B:
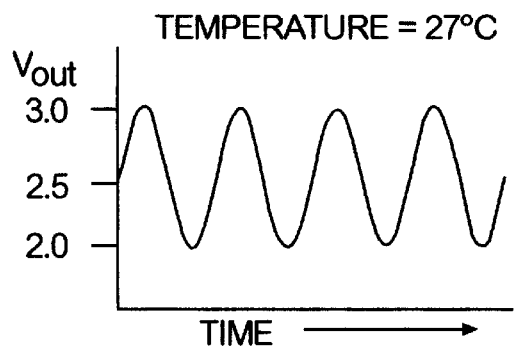
Figure 4C:
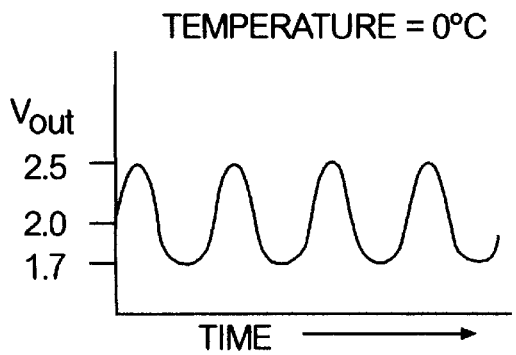
Figure 5C:
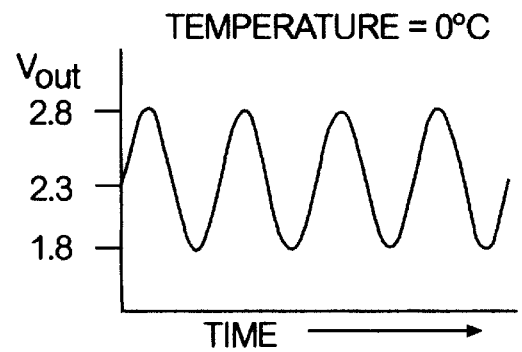

As is known to those skilled in the art, a varactor diode is a capacitor in which the value of its capacitance varies depending on the dc voltage applied to it. When the ambient temperature of the LC circuit formed by capacitor 18 and inductor 20 changes, the resonant frequency shifts from the desired center value. The dc voltage that is introduced on output line 28 by this resonant frequency shift is input to the varactor diode via the feedback circuit branch. The capacitance of the varactor diode, which is dependent on the dc voltage applied to it via the feedback branch, causes the overall capacitance of the LC circuit, now including varactor diode 32, capacitor 34, capacitor 18, and inductor 20, to change. The change in overall capacitance of the LC circuit caused by the capacitance of the varactor diode causes the resonant frequency of the quadrature detector to shift to be more closely maintained at the desired center frequency. In this manner, the unwanted dc voltage caused by ambient temperature variations is reduced or eliminated, allowing the circuit to reduce distortion, as shown in FIG. 5. It will be understood that when the ambient temperature does not change, the resonant frequency does not drift, but is maintained at the center frequency, and no dc voltage is introduced.

Thus, the present invention takes advantage of the shift in the dc voltage which is caused by the change in the resonant frequency of the LC circuit as ambient temperature changes. By filtering out the ac voltage on output line 24, the dc voltage on output line 28 can be fed back to the varactor diode in parallel with capacitor 18 of the LC circuit. In this manner, the resonant frequency of the LC circuit can be held more closely to 10.7 MHz, for example, as the temperature varies. Other variations of the technique may be implemented, such as using an op-amp integrator in the feedback loop to hold the resonant frequency at 10.7 MHz, for example, over any specified temperature range. The present invention can be implemented with either discrete components or integrated circuit quadrature detectors.

The circuit of the present invention can be implemented not only for analog audio input signals, but also for digital data signals. For digital data signals, if the quadrature detector is tuned to 78 MHz, for example, then the data transmitted to the receiver is scrambled so that the data is transmitted at 77.9 MHz, for example, half of the time and at 78.1 MHz, for example, the other half of the time. This is commonly done in the art, and is referred to as pseudorandom scrambling at the transmitter side, and self-synchronizing descrambling at the receiver side. This causes the frequency of the transmitted spectrum to be centered at 78 MHz, to which the resonant frequency of the quadrature detector can be tuned. Therefore, the addition of the varactor diode to the quadrature detector in accordance with the present invention provides temperature stability for the FM receiver when receiving digital signals in a similar manner as for analog audio signals.

While the invention has been disclosed in preferred forms, it will be apparent to those skilled in the art that many modifications, additions, and deletions can be made without departing from the spirit and scope of the invention as set forth in the following claims.

What is claimed is:

1. An FM quadrature detector, comprising:
    a mixer having a first input, a second input, and an output;
    an input signal coupled to the first input of the mixer;
    a tuning circuit coupled to the input signal and also coupled to the second input of the mixer;
    a varactor coupled to the tuning circuit; and
    a low pass filter having an input and an output, the input of the low pass filter being coupled to the output of the mixer, and the output of the low pass filter coupled being coupled to the varactor;
    whereby the varactor is responsive to the output of the low pass filter for adjusting the resonant frequency of the tuning circuit.

2. The FM quadrature detector of claim 1, wherein the tuning circuit is an LC circuit.

3. The FM quadrature detector of claim 1, wherein the tuning circuit has a first resonant frequency at a first temperature thereby causing said output to be a first voltage, and wherein the tuning circuit has a second resonant frequency at a second temperature thereby causing said output to be a second voltage, and whereby said second voltage causes the varactor to cause the tuning circuit to maintain approximately the first resonant frequency.

4. The FM quadrature detector of claim 3, wherein the capacitance of the varactor causes the overall capacitance of the tuning circuit to change such that the resonant frequency of the tuning circuit including the varactor shifts to be more closely maintained at approximately the first resonant frequency.

5. The FM quadrature detector of claim 1, further comprising a second low pass filter interposed between the output of the low pass filter connected to the mixer, and the varactor.

6. A method for modifying an FM quadrature detector to provide temperature stability, the FM quadrature detector comprising a mixer having a first input, a second input, and an output; an input signal coupled to the first input of the mixer; a tuning circuit coupled to the input signal and to the second input of the mixer; a low pass filter having an input and an output; and the input of the low pass filter coupled to the output of the mixer; the method comprising the steps of:
    coupling a varactor to the tuning circuit and to the second input of the mixer; and
    coupling the output of the low pass filter to the varactor via a feedback loop.

7. An FM quadrature detector for providing a demodulated signal output, comprising:
    a mixer having a first input, a second input, and an output;
    a modulated input signal coupled to the first input of the mixer;
    a tuning circuit coupled to the modulated input signal and also coupled to the second input of the mixer;
    a varactor coupled to the tuning circuit; and
    a low pass filter having an input and an output, the input of the low pass filter being coupled to the output of the mixer, and the output of the low pass filter coupled being coupled to the varactor, the output of the low pass filter being a demodulated signal output;
    whereby the varactor is responsive to the output of the low pass filter for adjusting the resonant frequency of the tuning circuit.

8. The FM quadrature detector of claim 7, further comprising a second low pass filter interposed between the output of the low pass filter connected to the mixer, and the varactor.

* * * * *